United States Patent
Goodwin et al.

(10) Patent No.: US 7,289,327 B2
(45) Date of Patent: Oct. 30, 2007

(54) ACTIVE COOLING METHODS AND APPARATUS FOR MODULES

(75) Inventors: Paul Goodwin, Austin, TX (US); James Douglas Wehrly, Jr., Austin, TX (US)

(73) Assignee: Stakick Group L.P., Austin, TX (US)

( * ) Notice: Subject to any disclaimer, the term of this patent is extended or adjusted under 35 U.S.C. 154(b) by 0 days.

(21) Appl. No.: 11/364,489

(22) Filed: Feb. 27, 2006

(65) Prior Publication Data

US 2007/0201208 A1    Aug. 30, 2007

(51) Int. Cl.
*H05K 7/20* (2006.01)
*F28D 15/00* (2006.01)

(52) U.S. Cl. .................. 361/701; 361/699; 361/702; 361/749; 165/80.4; 165/104.33

(58) Field of Classification Search ........ 361/699–703, 361/711, 715, 719–720, 749, 751; 165/80.4, 165/104.33; 174/252
See application file for complete search history.

(56) References Cited

U.S. PATENT DOCUMENTS

| | | | |
|---|---|---|---|
| 3,372,310 A | 3/1968 | Kantor | |
| 3,436,604 A | 4/1969 | Hyltin | |
| 3,582,865 A * | 6/1971 | Franck et al. ................ | 439/67 |
| 3,654,394 A | 4/1972 | Gordon | |
| 3,704,455 A | 11/1972 | Scarbrough | |
| 3,718,842 A | 2/1973 | Abbott III, et al. | |
| 3,727,064 A | 4/1973 | Bottini | |
| 3,746,934 A | 7/1973 | Stein | |
| 3,766,439 A * | 10/1973 | Isaacson .................... | 361/714 |
| 3,772,776 A | 11/1973 | Weisenburger | |
| 4,169,642 A | 10/1979 | Mouissie | |
| 4,288,841 A | 9/1981 | Gogal | |
| 4,342,069 A | 7/1982 | Link | |
| 4,429,349 A | 1/1984 | Zachry | |
| 4,437,235 A | 3/1984 | McIver | |
| 4,513,368 A | 4/1985 | Houseman | |
| 4,547,834 A * | 10/1985 | Dumont et al. ............. | 361/722 |
| 4,567,543 A | 1/1986 | Miniet | |

(Continued)

FOREIGN PATENT DOCUMENTS

EP       122-687 A       10/1984

(Continued)

OTHER PUBLICATIONS

Pages 19-22 of Presentation by Netlist, Aug. 2004.

(Continued)

*Primary Examiner*—Jayprakash Gandhi
*Assistant Examiner*—Robert J. Hoffberg
(74) *Attorney, Agent, or Firm*—Fish & Richardson P.C.

(57) ABSTRACT

A circuit module that includes a system for reducing thermal variation and cooling the circuit module. In preferred embodiments, the module includes a thermally-conductive rigid substrate having first and second lateral sides, an edge, and an integrated cooling component. The integrated cooling component reduces thermal variation and cools the circuit module. Flex circuitry populated with a plurality of ICs and exhibiting a connective facility that comprises plural contacts for use with an edge connector is wrapped about the edge of the thermally-conductive substrate. Heat from the plurality of ICs is thermally-conducted by the thermally-conductive substrate to the integrated cooling component.

9 Claims, 11 Drawing Sheets

U.S. PATENT DOCUMENTS

| | | |
|---|---|---|
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A * | 7/1993 | Frankeny et al. ............ 361/718 |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,289,062 A | 2/1994 | Wyland |
| 5,309,986 A * | 5/1994 | Itoh ................ 165/104.26 |
| 5,313,097 A | 5/1994 | Haj-Ali-Ahmadi et al. |
| 5,347,428 A | 9/1994 | Carson et al. |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A * | 5/1998 | Clayton ..................... 361/749 |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bolleson |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |
| 6,178,093 B1 | 1/2001 | Bhatt et al. |
| 6,180,881 B1 | 1/2001 | Isaak |
| 6,187,652 B1 | 2/2001 | Chou et al. |

| | | | | | | |
|---|---|---|---|---|---|---|
| 6,201,695 B1 * | 3/2001 | Duesman et al. ............ 361/703 | 6,646,936 B2 | 11/2003 | Hamamatsu et al. | |
| 6,205,654 B1 | 3/2001 | Burns | 6,660,561 B2 | 12/2003 | Forthun | |
| 6,208,521 B1 | 3/2001 | Nakatsuka | 6,661,092 B2 | 12/2003 | Shibata et al. | |
| 6,208,546 B1 | 3/2001 | Ikeda | 6,677,670 B2 | 1/2004 | Kondo | |
| 6,214,641 B1 | 4/2001 | Akram | 6,683,377 B1 | 1/2004 | Shim et al. | |
| 6,215,181 B1 | 4/2001 | Akram et al. | 6,690,584 B2 | 2/2004 | Uzuka et al. | |
| 6,215,687 B1 | 4/2001 | Sugano et al. | 6,699,730 B2 | 3/2004 | Kim et al. | |
| 6,222,737 B1 | 4/2001 | Ross | 6,720,225 B1 | 4/2004 | Woo et al. | |
| 6,222,739 B1 | 4/2001 | Bhakta et al. | 6,720,652 B2 | 4/2004 | Akram et al. | |
| 6,225,688 B1 | 5/2001 | Kim et al. | 6,721,181 B1 * | 4/2004 | Pfeifer et al. ................ 361/704 |
| 6,232,659 B1 | 5/2001 | Clayton | 6,721,185 B2 | 4/2004 | Dong et al. | |
| 6,233,650 B1 | 5/2001 | Johnson et al. | 6,744,656 B2 | 6/2004 | Sugano et al. | |
| 6,234,820 B1 | 5/2001 | Perino et al. | 6,751,113 B2 | 6/2004 | Bhakta et al. | |
| 6,262,476 B1 | 7/2001 | Vidal | 6,756,661 B2 | 6/2004 | Tsuneda et al. | |
| 6,262,895 B1 | 7/2001 | Forthun | 6,760,220 B2 | 7/2004 | Canter et al. | |
| 6,265,660 B1 | 7/2001 | Tandy | 6,762,942 B1 | 7/2004 | Smith | |
| 6,266,252 B1 | 7/2001 | Karabatsos | 6,768,660 B2 | 7/2004 | Kong et al. | |
| 6,281,577 B1 | 8/2001 | Oppermann et al. | 6,833,981 B2 | 12/2004 | Suwabe et al. | |
| 6,288,907 B1 | 9/2001 | Burns | 6,833,984 B1 * | 12/2004 | Belgacem .................... 361/58 |
| 6,288,924 B1 | 9/2001 | Sugano et al. | 6,839,266 B1 | 1/2005 | Garrett, Jr. et al. | |
| 6,300,679 B1 | 10/2001 | Mukerji et al. | 6,841,868 B2 | 1/2005 | Akram et al. | |
| 6,316,825 B1 | 11/2001 | Park et al. | 6,850,414 B2 | 2/2005 | Benisek et al. | |
| 6,323,060 B1 | 11/2001 | Isaak | 6,873,534 B2 | 3/2005 | Bhakta et al. | |
| 6,336,262 B1 | 1/2002 | Dalal et al. | 6,878,571 B2 | 4/2005 | Isaak et al. | |
| 6,343,020 B1 | 1/2002 | Lin et al. | 6,884,653 B2 | 4/2005 | Larson | |
| 6,347,394 B1 | 2/2002 | Ochoa et al. | 6,914,324 B2 | 7/2005 | Rapport et al. | |
| 6,349,050 B1 | 2/2002 | Woo et al. | 6,919,626 B2 | 7/2005 | Burns | |
| 6,351,029 B1 | 2/2002 | Isaak | 6,956,284 B2 | 10/2005 | Cady et al. | |
| 6,357,023 B1 | 3/2002 | Co et al. | 7,053,478 B2 | 5/2006 | Roper et al. | |
| 6,358,772 B2 | 3/2002 | Miyoshi | 7,094,632 B2 | 8/2006 | Cady et al. | |
| 6,360,433 B1 | 3/2002 | Ross | 7,180,167 B2 | 2/2007 | Partridge et al. | |
| 6,368,896 B2 | 4/2002 | Farnworth et al. | 2001/0001085 A1 | 5/2001 | Hassanzadeh et al. | |
| 6,370,668 B1 | 4/2002 | Garrett, Jr. et al. | 2001/0013423 A1 | 8/2001 | Dalal et al. | |
| 6,376,769 B1 | 4/2002 | Chung | 2001/0015487 A1 | 8/2001 | Forthun | |
| 6,392,162 B1 | 5/2002 | Karabatsos | 2001/0026009 A1 | 10/2001 | Tsuneda et al. | |
| 6,404,043 B1 | 6/2002 | Isaak | 2001/0028588 A1 | 10/2001 | Yamada et al. | |
| 6,410,857 B1 | 6/2002 | Gonya | 2001/0035572 A1 | 11/2001 | Isaak | |
| 6,426,240 B2 | 7/2002 | Isaak | 2001/0040793 A1 | 11/2001 | Inaba | |
| 6,426,549 B1 | 7/2002 | Isaak | 2001/0052637 A1 | 12/2001 | Akram et al. | |
| 6,426,560 B1 | 7/2002 | Kawamura et al. | 2002/0001216 A1 | 1/2002 | Sugano et al. | |
| 6,428,360 B2 | 8/2002 | Hassanzadeh et al. | 2002/0006032 A1 | 1/2002 | Karabatsos | |
| 6,433,418 B1 | 8/2002 | Fujisawa et al. | 2002/0030995 A1 | 3/2002 | Shoji | |
| 6,444,921 B1 | 9/2002 | Wang et al. | 2002/0076919 A1 | 6/2002 | Peters et al. | |
| 6,446,158 B1 | 9/2002 | Karabatsos | 2002/0094603 A1 | 7/2002 | Isaak | |
| 6,449,159 B1 | 9/2002 | Haba | 2002/0101261 A1 | 8/2002 | Karabatsos | |
| 6,452,826 B1 | 9/2002 | Kim et al. | 2002/0139577 A1 | 10/2002 | Miller | |
| 6,459,152 B1 | 10/2002 | Tomita et al. | 2002/0164838 A1 | 11/2002 | Moon et al. | |
| 6,462,412 B2 | 10/2002 | Kamei et al. | 2002/0180022 A1 | 12/2002 | Emoto | |
| 6,465,877 B1 | 10/2002 | Farnworth et al. | 2002/0185731 A1 | 12/2002 | Akram et al. | |
| 6,465,893 B1 | 10/2002 | Khandros et al. | 2002/0196612 A1 | 12/2002 | Gall et al. | |
| 6,472,735 B2 | 10/2002 | Isaak | 2003/0002262 A1 | 1/2003 | Benisek et al. | |
| 6,473,308 B2 | 10/2002 | Forthun | 2003/0026155 A1 | 2/2003 | Yamagata | |
| 6,486,544 B1 | 11/2002 | Hashimoto | 2003/0035328 A1 | 2/2003 | Hamamatsu et al. | |
| 6,489,687 B1 | 12/2002 | Hashimoto | 2003/0045025 A1 | 3/2003 | Coyle et al. | |
| 6,502,161 B1 | 12/2002 | Perego et al. | 2003/0049886 A1 | 3/2003 | Salmon | |
| 6,514,793 B2 | 2/2003 | Isaak | 2003/0064548 A1 | 4/2003 | Isaak | |
| 6,521,984 B2 | 2/2003 | Matsuura | 2003/0081387 A1 | 5/2003 | Schulz | |
| 6,528,870 B2 | 3/2003 | Fukatsu et al. | 2003/0081392 A1 | 5/2003 | Cady et al. | |
| 6,531,772 B2 | 3/2003 | Akram et al. | 2003/0089978 A1 | 5/2003 | Miyamoto et al. | |
| 6,544,815 B2 | 4/2003 | Isaak | 2003/0090879 A1 | 5/2003 | Doblar et al. | |
| 6,552,910 B1 | 4/2003 | Moon et al. | 2003/0096497 A1 | 5/2003 | Moore et al. | |
| 6,552,948 B2 | 4/2003 | Woo et al. | 2003/0109078 A1 | 6/2003 | Takahashi et al. | |
| 6,560,117 B2 | 5/2003 | Moon | 2003/0116835 A1 | 6/2003 | Miyamoto et al. | |
| 6,566,746 B2 | 5/2003 | Isaak et al. | 2003/0159278 A1 | 8/2003 | Peddle | |
| 6,572,387 B2 | 6/2003 | Burns et al. | 2003/0168725 A1 | 9/2003 | Warner et al. | |
| 6,573,593 B1 | 6/2003 | Syri et al. | 2004/0000708 A1 | 1/2004 | Rapport et al. | |
| 6,576,992 B1 | 6/2003 | Cady et al. | 2004/0012991 A1 | 1/2004 | Kozaru | |
| 6,588,095 B2 | 7/2003 | Pan | 2004/0021211 A1 | 2/2004 | Damberg | |
| 6,590,282 B1 | 7/2003 | Wang et al. | 2004/0099938 A1 | 5/2004 | Kang et al. | |
| 6,600,222 B1 | 7/2003 | Levardo | 2004/0150107 A1 | 8/2004 | Cha et al. | |
| 6,614,664 B2 | 9/2003 | Lee | 2004/0229402 A1 | 11/2004 | Cady et al. | |
| 6,627,984 B2 | 9/2003 | Bruce et al. | 2004/0236877 A1 | 11/2004 | Burton | |
| 6,629,855 B1 | 10/2003 | North et al. | 2005/0082663 A1 * | 4/2005 | Wakiyama et al. ......... 257/717 |

| | | | |
|---|---|---|---|
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335695 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/009231 A | 1/2002 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 2003/037053 A1 | 5/2003 |
| WO | WO 2004/109802 A1 | 12/2004 |

OTHER PUBLICATIONS

Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory. Published on the Internet.
Chip Scale Review Online—An Independent Journal Dedicated to the Advancement of Chip-Scale Electronics.(Website 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian VAL, Thomson-CSF DCS Computer Division, Thierry Lemoine, Thomson-CSF RCM Radar Countermeasures Division.
High Density Memory Packaging Technology High Speed Imaging Applications, Dean Frew, Texas Instruments Incorporated.
Vertically-Integrated Package, Alvin Weinberg, Pacesetter, Inc. and W. Kinzy Jones, Florida International University.
Search Report for GB Application No. GB0516622.8, May 25, 2006.
International Search Report for Application No. PCT/US05/28547, Aug. 18, 2006.
PCT/US05/28547 International Search Report and Written Opinion, PCT, Aug. 18, 2006.
PCT/US05/28547 Notification Concerning Transmittal of Copy of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.
2005203591, Australian Search Report dated Apr. 30, 2007.

* cited by examiner

ACTIVE COOLING METHODS AND APPARATUS FOR MODULES

FIELD

The present invention relates to high density circuit modules, particularly reducing thermal variation and cooling circuit modules.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Systems that employ DIMMs provide, however, very limited space for such devices and conventional DIMM-based solutions have typically provided only a moderate amount of memory expansion.

As bus speeds have increased, fewer devices per channel can be reliably addressed with a DIMM-based solution. For example 288 ICs or devices per channel may be addressed using the SDRAM-100 bus protocol with an unbuffered DIMM. Using the DDR-200 bus protocol, approximately 144 devices may be address per channel. With the DDR2-400 bus protocol, only 72 devices per channel may be addressed. This constraint has led to the development of the fully-buffered DIMM (FB-DIMM) with buffered Command Address (C/A) and data in which 288 devices per channel may be addressed. With the FB-DIMM, not only has capacity increased, pin count has declined to approximately 69 signal pins from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility.

In a traditional DIMM typology, two circuit board surfaces are available for placement of memory devices. Consequently, the capacity of a traditional DIMMs is area-limited. There are several known methods to improve the limited capacity of a DIMM or other circuit board. In one strategy, for example, small circuit boards (daughter cards) are connected to the DIMM to provide extra mounting space. The additional connection may cause, however, flawed signal integrity for the data signals passing from the DIMM to the daughter card and the additional thickness of the daughter card(s) increases the profile of the DIMM.

Multiple die packages (MDP) are also used to increase DIMM capacity while preserving profile conformity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another strategy used to increase circuit board capacity. This scheme increases capacity by stacking packaged integrated circuits to create a high-density circuit module for mounting on the circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may alter, however, system requirements such as, for example, required cooling airflow or the minimum spacing around a circuit board on its host system.

As DIMM capacities and memory densities increase, however, thermal issues become more important in DIMM design and applications. Because of the directional air flow from a system fan, the heat generated in a typical DIMM is not evenly distributed. Consequently, different parts of the DIMM exhibit different temperatures during typical operations. As is well known, circuit performance and timing can be affected by temperature. Consequently, some circuitry on-board the DIMM will have different timing characteristics than other circuitry located closer to or further from the cooling air flow. In short, there will be a thermally-induced timing skew between constituent devices. This may not affect performance at slower speeds where timing windows are larger but as bus and RAM speeds increase, the thermally-induced skew between devices on a DIMM becomes more significant reducing the timing window or eye.

Thermal energy management in modules is an issue of increasing importance. What is needed, therefore, are systems and methods that provide enhanced module cooling and minimization of thermally-induced skew amongst module devices.

SUMMARY

A circuit module is provided that includes a system for reducing thermal variation and cooling the circuit module. In preferred embodiments, the module includes a thermally-conductive rigid substrate having first and second lateral sides, an edge, and an integrated cooling component. The integrated cooling component reduces thermal variation and cools the circuit module. Flex circuitry populated with a plurality of ICs and exhibiting a connective facility that comprises plural contacts preferably for use with an edge connector is wrapped about the edge of the thermally-conductive substrate. Heat from the plurality of ICs is thermally-conducted by the thermally-conductive substrate to the integrated cooling component.

A circuit module is provided that includes a system for reducing thermal variation and cooling the circuit module. The module includes a thermally-conductive rigid substrate having first and second lateral sides and an edge. The substrate defines a hollow cavity that reduces thermal variation and cools the circuit module. Flex circuitry populated with a plurality of ICs and exhibiting a connective facility that comprises plural contacts for use with an edge connector is wrapped around the edge of the thermally-conductive substrate. Heat from the plurality of ICs is thermally-conducted by the thermally-conductive substrate to the hollow cavity.

A circuit module is further provided that includes a system for reducing thermal variation and cooling the circuit module. The module includes a thermally-conductive rigid substrate having first and second lateral sides and an edge. Flex circuitry populated with a plurality of ICs and exhibiting a connective facility that comprises plural contacts for use with an edge connector is wrapped about the edge of the thermally-conductive substrate. Heat from the plurality of ICs is thermally-conductive by the thermally-conductive substrate. The module also includes one or more heat pipes. Each heat pipe is sealed water-tight and includes a wick and a vaporizable fluid.

DETAILED DESCRIPTION

Embodiments of a system for reducing thermal variation and cooling high-density circuit modules may take advantage of flex-based circuit technology. The embodiments described herein may be incorporated in flex-based circuit modules, such as flex-based circuit modules, described in U.S. patent application Ser. No. 11/007,551, filed Dec. 8, 2004 and U.S. patent application Ser. No. 11/193,954, filed Jul. 24, 2005, both of which are owned by assignee Staktek Group LP and hereby incorporated by reference. Embodiments may also utilize non-flex-based circuit modules.

Figure 1A:
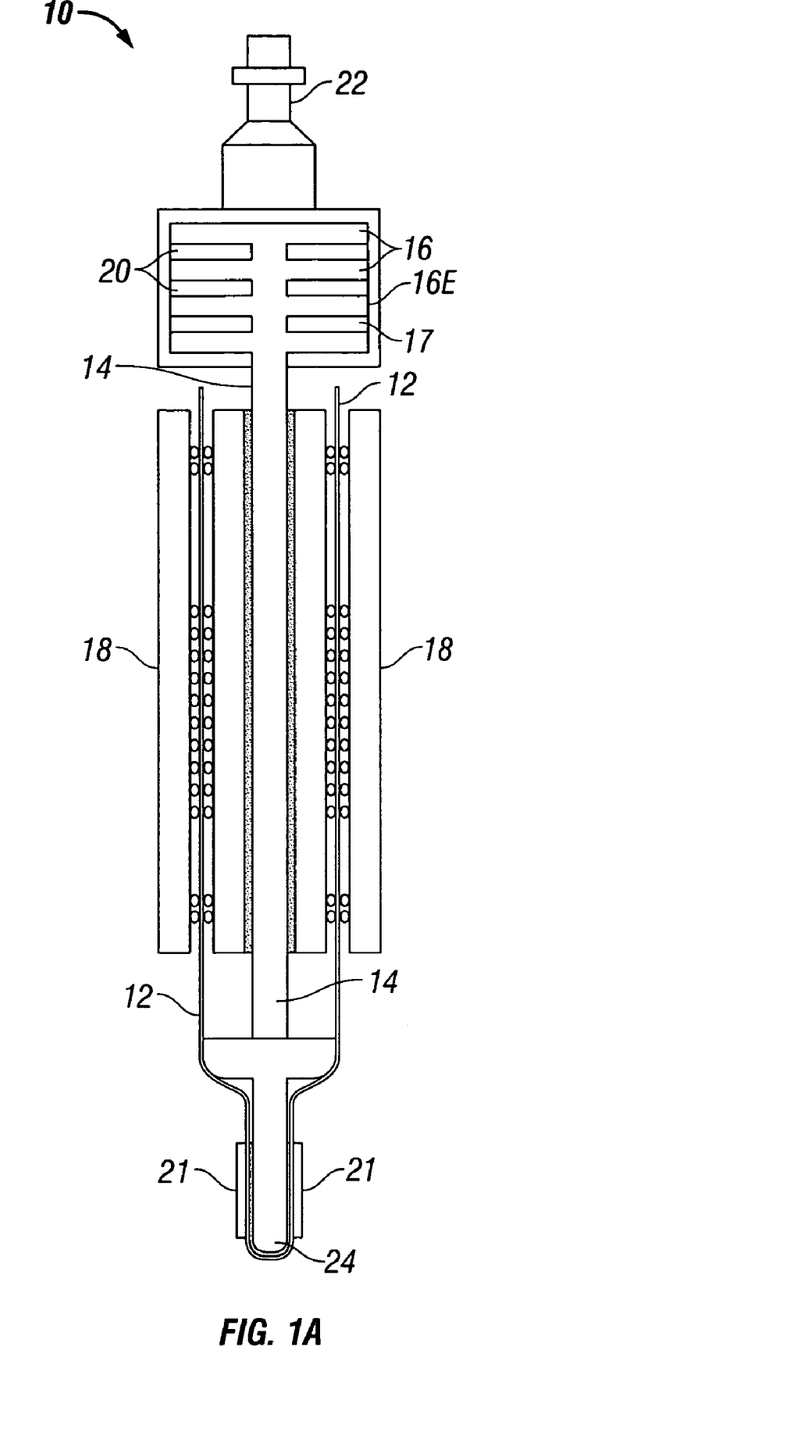
FIGS. 1A and 1B are cross-sectional and side-view depictions of an embodiment of a system for reducing thermal variation and cooling high density circuit modules.
Figure 1B:
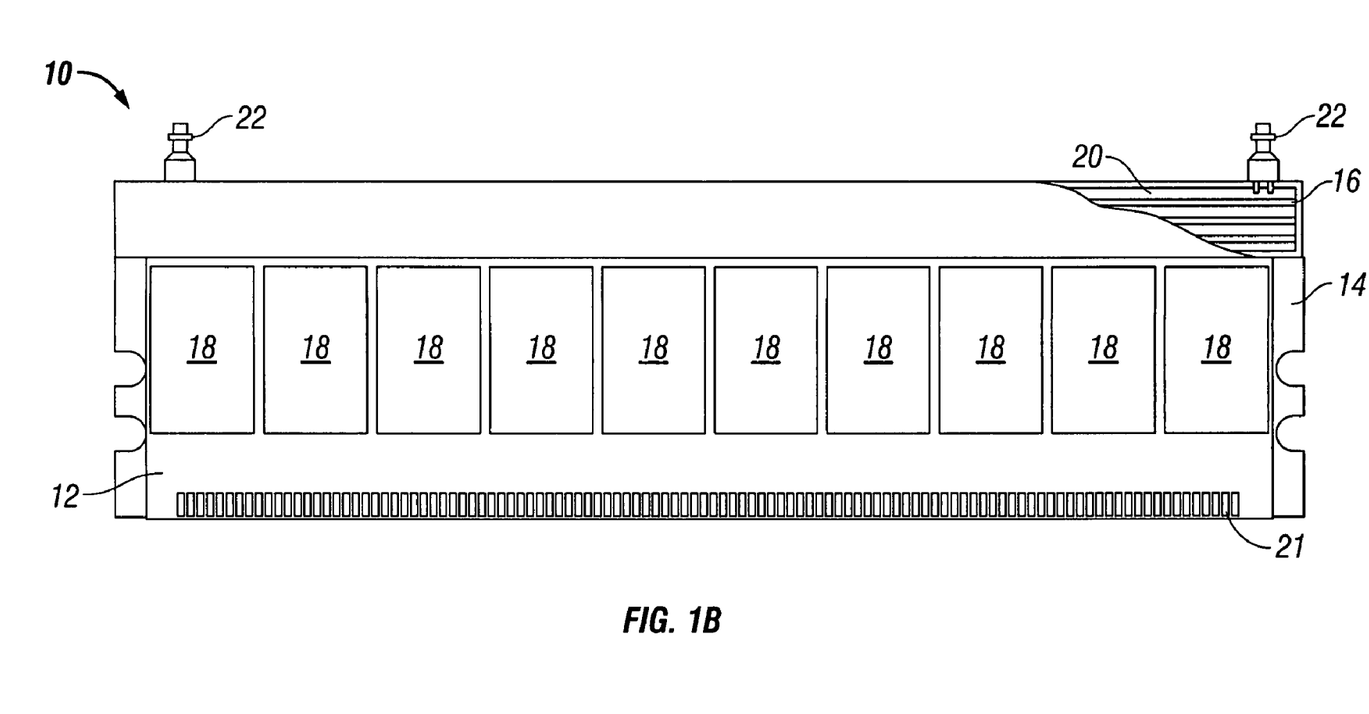

With reference now to FIGS. 1A and 1B, shown are diagrams illustrating an embodiment of a system for reducing thermal variation and cooling circuit modules. FIG. 1A illustrates a cross-section of a circuit module 10. Circuit module 10 may be a flex-based module devised to supplant traditional DIMMs. Circuit module 10 includes integrated circuits (ICs) 18 disposed along each of two sides of flex circuitry 12 that is wrapped about substrate 14. ICs 18 may be, for example, memory CSPs. Flex circuitry 12 exhibits a connective facility that comprises plural contacts 21 for use with an edge connector (see discussion of edge 24 below). Substrate 14 may also be referred to as the core of the module 10. Substrate 14 may be comprised of thermally-conductive material and may be, for example, comprised of a metallic material or thermally-conductive plastic or carbon material. In the embodiment shown, substrate 14 exhibits enclosed fins 16. Enclosing fins 16 creates sealed chamber 20 within which may be devised from multiple components or extruded, for example. The plural edges 16E of fins 16 may be faced with plates to create sealed chamber 20 within which may be confined or, preferably, circulated cooling fluid 17. Fins 16 and sealed chamber 20 are positioned on an axis of substrate 14, with fins 16 extending perpendicularly from the orientation of the axis. The system for reducing thermal variation and cooling high-density circuit modules utilizes the additional surface area provided by fins 16 and optionally circulating cooling fluid 17 (e.g., water or other fluid) in sealed chamber 20, to increase the removal of heat from circuit module 10. Those of skill will, however, recognize that while not limited to a perpendicular arrangement for fins 16, most applications impose limitations on module profiles that will typically cause perpendicular arrangements to be preferred.

Edge or end 24 of substrate 14 is shaped to function as a male side edge of an edge card connector. Edge 24 may take on other shapes devised to mate with various connectors or sockets. Flex circuitry 12 is preferably wrapped around edge 24 of substrate 14 and may be laminated or adhesively connected to substrate 14. In other embodiments multiple flex circuits may be employed.

FIG. 1B illustrates a side view of circuit module 10 with a partial cross-sectional view of sealed chamber 20 and fins 16. As shown, either after enclosing fins 16 or prior, substrate 14 may be machined so that at each end of sealed chamber 20 the spaces between fins 16 are open to each other. Fittings 22 may be then inserted into each end of sealed chamber 20 so that a fluid may be pumped into sealed chamber 20 and the seal maintained. The open space at one end of sealed chamber 20 is shown in the partial cross-sectional view. Also shown are plurality of ICs 18 disposed along one side of flex circuitry 12 on one side of substrate 14.

Fittings 22 may be used to couple circuit module 10 to a recirculating system. For example, if circuit module 10 were a DIMM, edge 24 may be inserted into a socket on a mother board, connecting the DIMM with the mother board, and a recirculating system coupled to fittings 22 to re-circulate fluid in sealed chamber 20, reducing thermal variation while cooling the DIMM. Conversely, the DIMM may be disconnected from the mother board and removed from the recirculating system. The embodiment shown in FIGS. 1A-1B provides active cooling for circuit module 10, integrated cooling inside substrate (core) 14 (e.g., instead of a heat exchanger applied to the outside), and, by maintaining a thin profile of circuit module, enables circuit module 10 to get standard air cooling as well as the circulated cooling.

Figure 2:
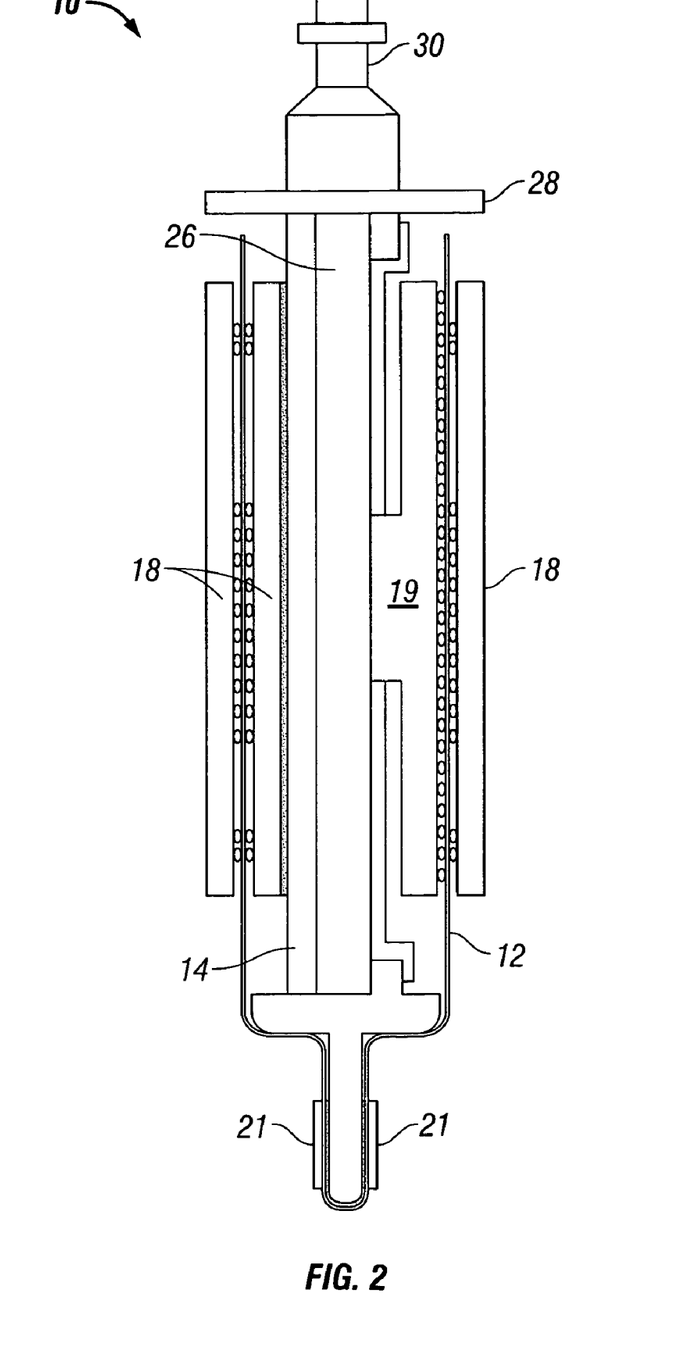
FIG. 2 is a cross-sectional depiction of an embodiment of a system for reducing thermal variation and cooling high density circuit modules.

With reference now to FIG. 2, shown is another embodiment of the system for reducing thermal variation and cooling circuit modules. FIG. 2 illustrates a cross-sectional view of circuit module 10. As above, circuit module 10 may be a flex-based DIMM. Circuit module 10 includes ICs 18 disposed along each of two sides of flex circuitry 12 that is wrapped about substrate (or core) 14. Depicted module 10 further includes IC 19 which is depicted as an advanced memory buffer (AMB). Substrate 14 may be comprised of thermally-conductive material and may be, for example, comprised of a metallic material or thermally-conductive plastic or carbon material. The size of circuit module 10 may be modified as per end-use requirements.

In the embodiment shown, substrate 14 includes hollow cavity 26 that may be extruded from substrate 14. Alternatively, substrate 14 may be comprised of multiple pieces of, e.g., aluminum that when assembled create hollow cavity 26. Hollow cavity 26 may be sealed at the ends of circuit module 10 or left open to allow air flow through cavity 26. Substrate may include a cap 28 (at the top of cavity 26) and fittings 30, similar to fittings 22 above, so that a fluid may be circulated through cavity 26 to remove heat if the ends of cavity 26 are also sealed. Cavity 26 may be coupled to a recirculating system through fittings 30, as described above.

The positioning of cavity 26 in the center of circuit module 10, near the two folded sides of flex circuitry 12 and ICs 18 and IC 19 disposed on flex circuitry 12, enables fluid to be circulated very close to the heat sources (i.e., ICs).

Those of skill will recognize from the depiction of FIG. 2 that module 10 include ICs of a variety of functions including but not limited to memory, such as ICs 18 and AMB 19. Consequently, at the expense of minimal added thickness, the embodiments shown in FIG. 2 provides enhanced cooling and heat distribution. The embodiment shown in FIG. 2 provides passive and/or active cooling and integrated cooling inside substrate (core) 14 (e.g., instead of a heat exchanger applied to the outside).

Figure 3A:
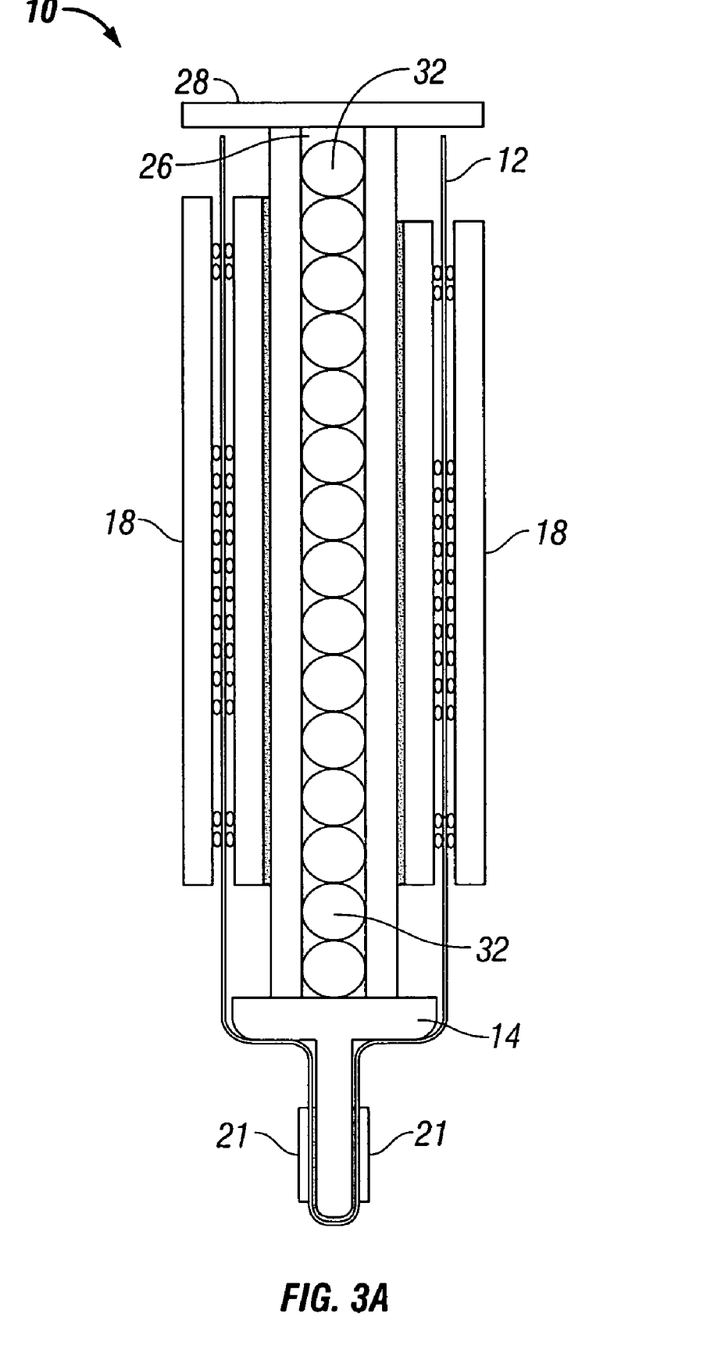
FIGS. 3A and 3B are cross-sectional and perspective depictions of an embodiment of a system for reducing thermal variation and cooling high density circuit modules.
Figure 3B:
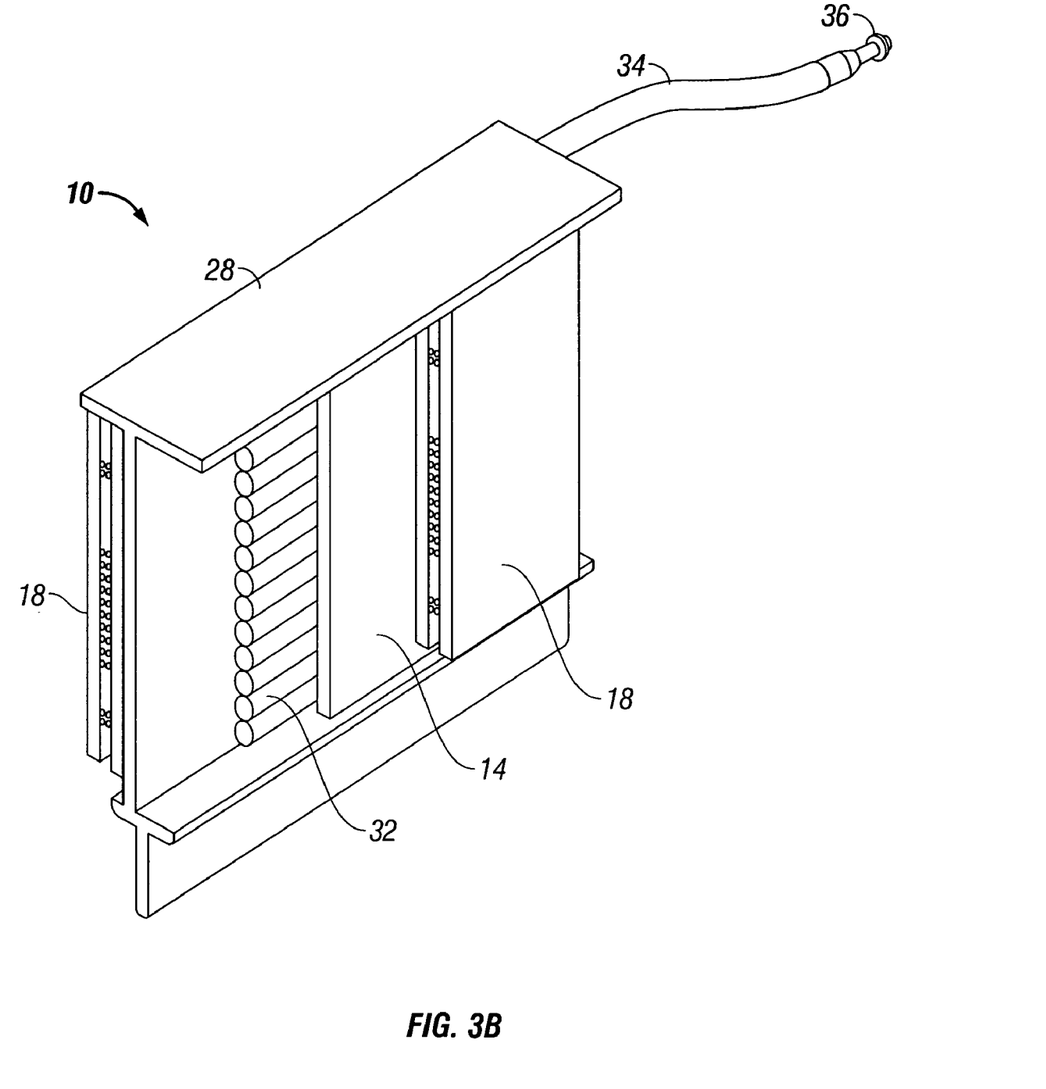

With reference now to FIGS. 3A-3B, another embodiment of the system for reducing thermal variation and cooling circuit modules is depicted. FIG. 3A illustrates a cross-sectional view of circuit module 10. Circuit module 10 may supplant a traditional DIMM. Circuit module 10 includes ICs 18 disposed along each of two sides of flex circuitry 12 that is wrapped about substrate (or core) 14 and may include other ICs such as an AMB or logic, for example. Substrate 14 may be comprised of thermally-conductive material and may be, for example, comprised of a metallic material or thermally-conductive plastic or carbon material. Substrate 14 includes hollow cavity 26, which may be formed as discussed above.

In the depicted embodiment, cavity 26 houses heat exchanger 32. Heat exchanger 32 includes a series of parallel pipes. Other types of heat exchangers 32 may be used, such, for example, as a coiled continuous pipe. As shown in the perspective, cross-sectional view in FIG. 3B, heat exchanger 32 may be coupled to a recirculating system with short tubes 34 with fittings 36 extending away from a side or sides of circuit module 10 (only one short tube 34 with fitting 36 is shown in FIG. 3B). Alternatively, tubes 34 may extend from the top of circuit module 10. Other couplings to a recirculating system, such as fittings held in brackets on circuit module 10 may be used. Substrate 14 may also include a cap 28 that covers the top of cavity 26.

Fluid may be circulated through heat exchanger 32 (e.g., by a recirculating system) to cool circuit module 10 and minimize thermal variation. By utilizing heat exchanger 32 positioned within cavity 26, the necessity of sealing cavity 26 is avoided. This simplifies the manufacturing and assembly process of circuit module 10. As with the embodiment shown in FIG. 2, by positioning heat exchanger 32 in cavity 26 near flex circuitry 12 and the ICs, the embodiment in FIGS. 3A and 3B provides enhanced cooling and heat distribution at the expense of minimal added thickness. As above, the embodiment shown in FIGS. 3A and 3B provides active cooling and integrated cooling inside substrate (core) 14 (e.g., instead of a heat exchanger applied to the outside).

Figure 4:
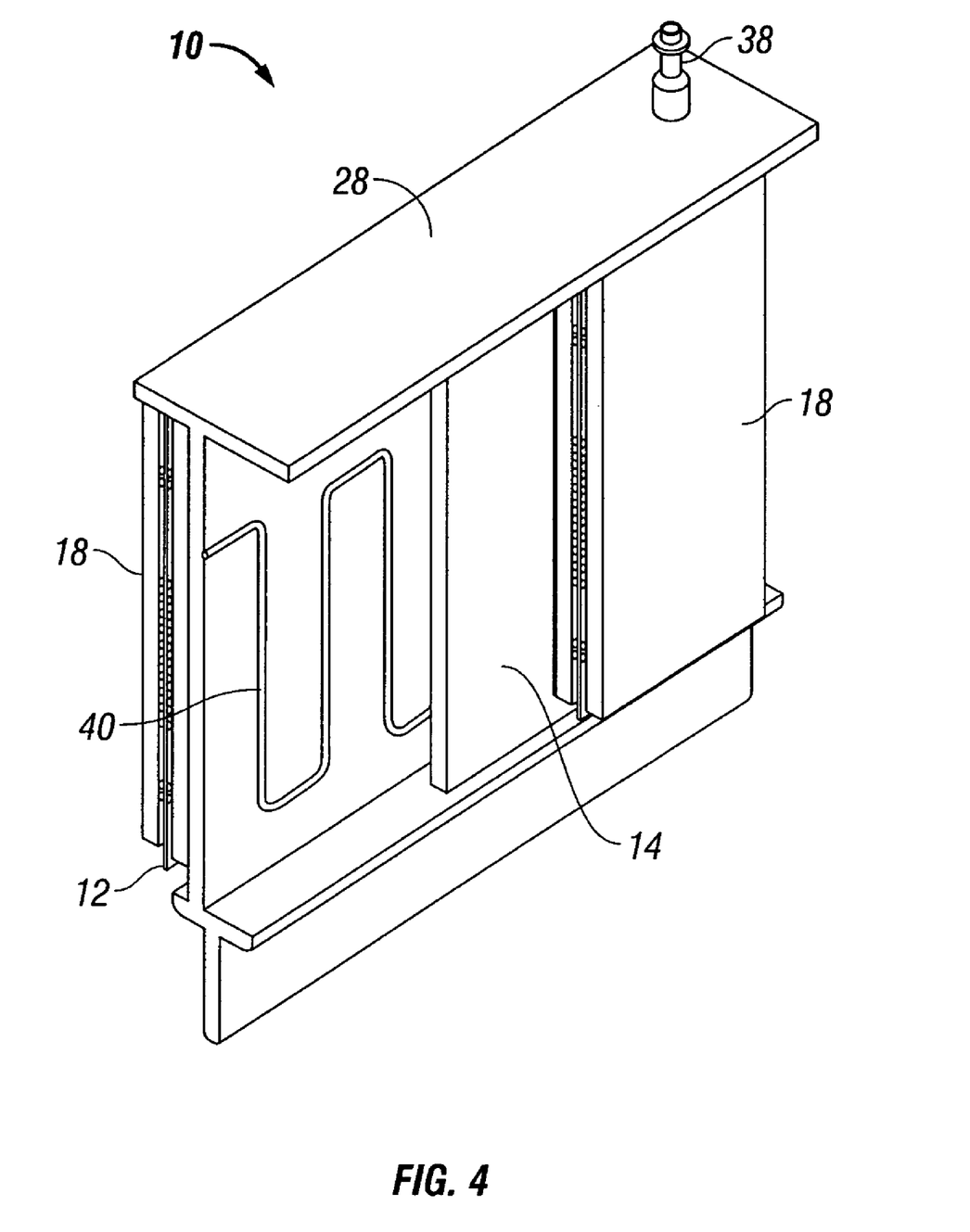
FIG. 4 is a cross-sectional perspective depiction of an embodiment of a system for reducing thermal variation and cooling high density circuit modules.

With reference now to FIG. 4, another embodiment of the system for reducing thermal variation and cooling circuit modules is shown. FIG. 4 illustrates a perspective, cross-sectional view of an exemplar circuit module 10. In the depicted preferred embodiment, circuit module 10 is devised as a flex-based replacement for a traditional DIMM. Circuit module 10 includes ICs such as ICs 18 disposed along each of two sides of flex circuitry 12 that is wrapped about substrate (or core) 14. Substrate 14 may be comprised of thermally-conductive material and may be, for example, comprised of a metallic material or thermally-conductive plastic or carbon material. Substrate 14 includes hollow cavity 26, which may be formed as discussed above or by bonding plates together, for example, so that a channel routed in the substrate becomes a sealed chamber. Substrate 14 includes a cap 28 that covers the top of hollow cavity 26.

In the embodiment shown here, circular module 10 includes fittings 38 on top of cap 28 (only one fitting 38 is shown in FIG. 4). Cavity 26 houses routed channel 40 that is routed from one fitting 38 to the other. If substrate 14 is formed from separate pieces, the pieces may be laminated together to form a watertight path. Routed channel 40 may be a series of parallel paths or a single channel meandering from one side of circuit module 10 to another. Fittings 38 may couple routed channel 40 to a recirculating system as described above. As above, positioning routed channel 40 in cavity 26 near flex circuitry 12 and the ICs which are the heat sources, provides enhanced cooling and heat distribution at the expense of minimal added thickness. The embodiment shown in FIG. 4 provides active cooling and integrated cooling inside substrate (core) 14 (e.g., instead of a heat exchanger applied to the outside).

Figure 5:
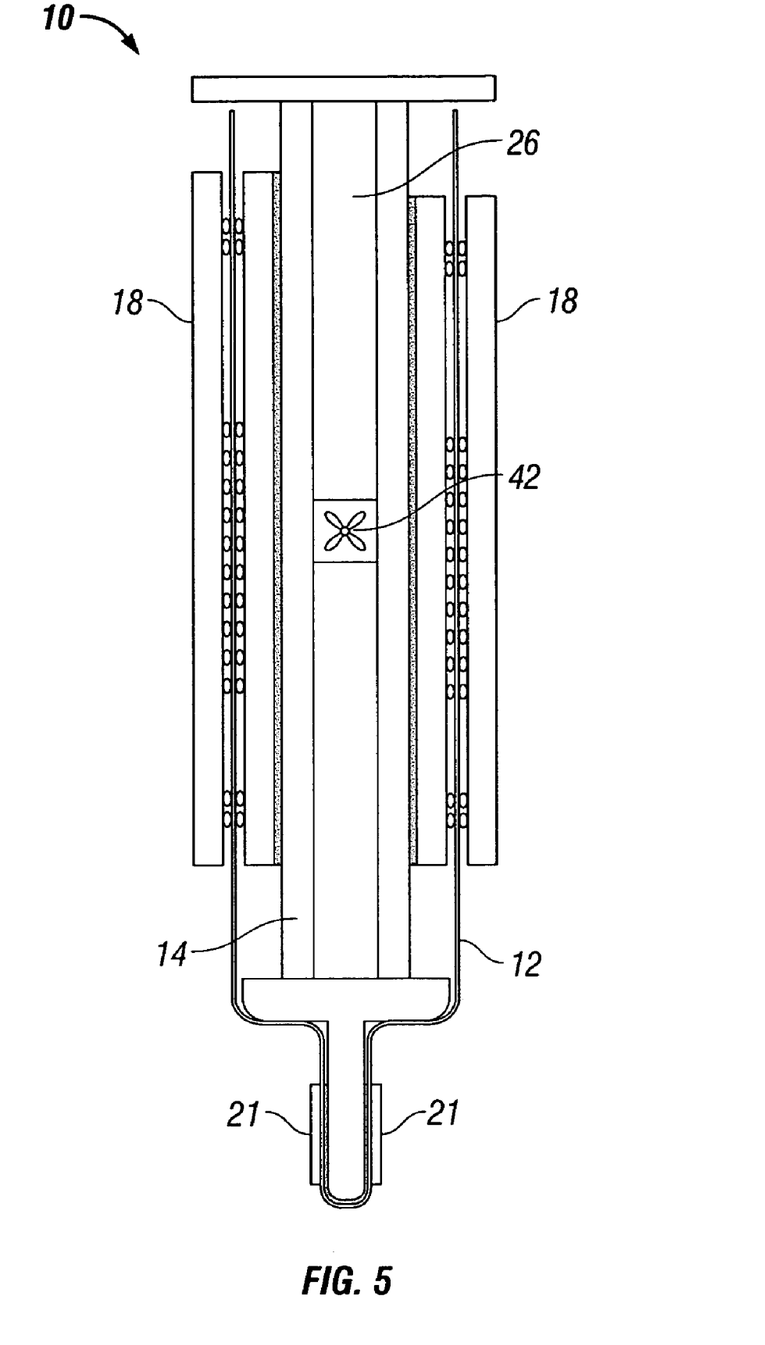
FIG. 5 is a cross-sectional depiction of an embodiment of a system for reducing thermal variation and cooling high density circuit modules.

With reference now to FIG. 5, shown is another embodiment of the system for reducing thermal variation and cooling circuit modules. FIG. 5 illustrates a perspective, cross-sectional view of circuit module 10. Circuit module 10 includes ICs 18 disposed along each of two sides of flex circuitry 12 that is wrapped about substrate (or core) 14. Substrate 14 includes hollow cavity 26, which may be formed as discussed above.

In the embodiment shown in FIG. 5, the ends of hollow cavity 26 are left open and air circulator 42 in hollow cavity 26. Air circulator 42 is installed to increase the air flow and the velocity of the air in the cavity 26 to improve cooling. Air circulator 42 provides grater air circulation than embodiments that simply have hollow cavity 26 with open ends. Air circulator 42 may be, e.g., a small fan, a piezo-electric crystal, or a turbulence generator. Other air circulators 42 known to those of skill in the art may be used. Multiple air circulators 42 may be installed in hollow cavity 26. Although, circuit module 10 may include a cap (not shown), leaving hollow cavity 26 open on top may increase passive and active cooling effects (e.g., from circuit board fan). The embodiment shown in FIG. 5 provides active cooling and integrated cooling inside substrate (core) 14 (e.g., instead of a heat exchanger applied to the outside). Because the cavity 26 is positioned near the heat sources, the embodiment provides effective cooling.

Figure 6:
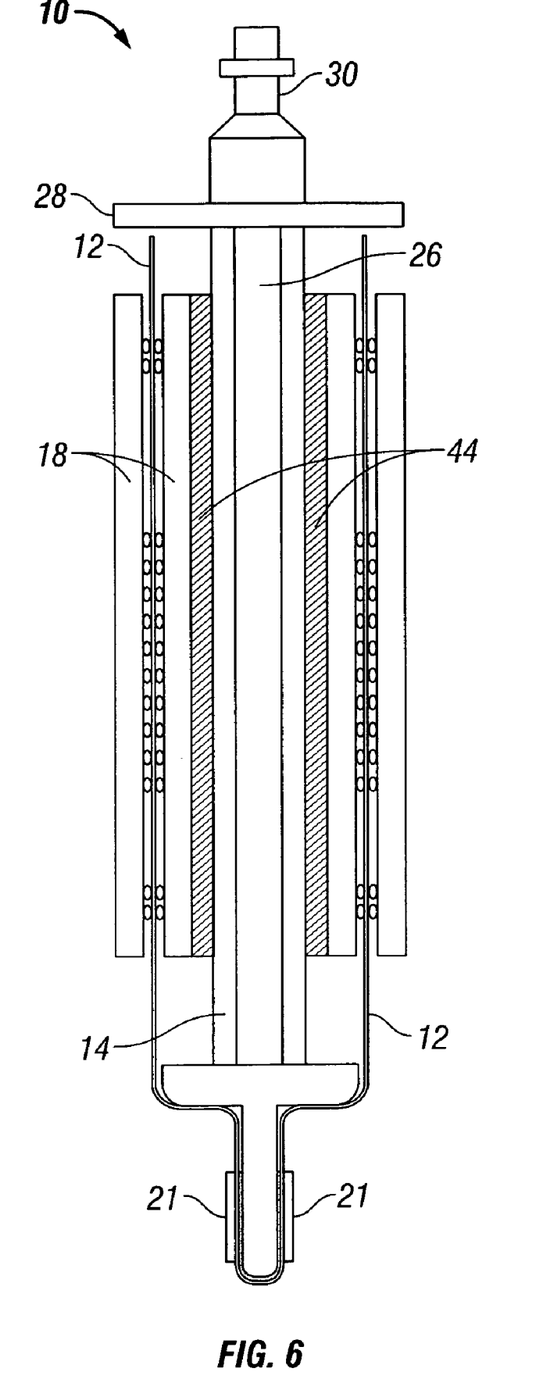
FIG. 6 is a cross-sectional depiction of an embodiment of a system for reducing thermal variation and cooling high density circuit modules.

Yet another embodiment of the system for reducing thermal variation and cooling circuit modules includes a semiconductor heat pump installed between substrate 14 and ICs 18 disposed on the side of flex circuit 12 facing substrate 14. A semiconductor heat pump may be installed on a circuit module with a simple substrate around which the flex circuit wraps or in combination with any of substrate 10 in the embodiments shown and described herein (e.g., see FIGS. 1-5). For example, with reference now to FIG. 6, shown is an embodiment of the system for reducing thermal variation and cooling high-density circuit modules that includes a semiconductor heat pump 44. FIG. 6 illustrates a perspective, cross-sectional view of circuit module 10. Circuit module 10 includes hollow cavity 26. Semiconductor heat pump 44 is installed between substrate 14 and IC(s) 18 disposed on one side of flex circuit 12 facing substrate 14. Additional semiconductor heat pumps 44 may be installed between substrate 14 and ICs 18 disposed on sides of flex circuit 12 facing substrate 14. Hollow cavity 26 may be configured, e.g., as described above, with fluid, couplings to a recirculating system, internal heat exchanger, routed channels, or air circulator.

Substrate 14 and, if present, hollow cavity 26 act as a heat sink for semiconductor heat pump 44. Semiconductor heat pump 44 reduces the temperature of adjacent ICs 18 and circuit module 10. The embodiment shown provides active cooling and integrated cooling inside substrate (core) 14 and inside circuit module 10 (e.g., instead of a heat exchanger applied to the outside).

Preferred embodiments of the system for reducing thermal variation and cooling circuit modules use a fluid to transfer heat from circuit modules 10 (e.g., DIMMs) to a remote component (e.g., recirculating system) that removes the heat so that a cool fluid may be re-circulated to circuit modules 10. A fluid, due to its increased mass over air, provides an efficient medium to take heat away from circuit module 10.

Figure 7A:
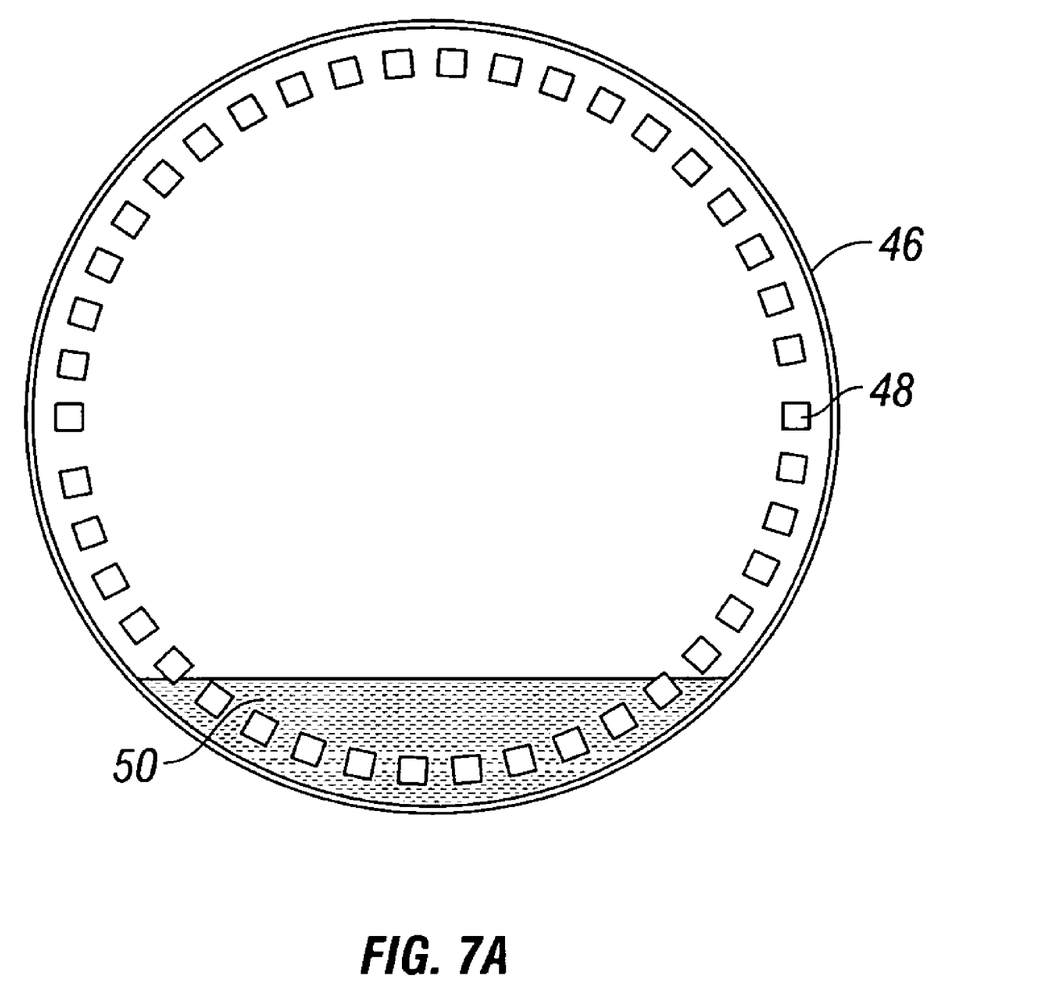
FIGS. 7A, 7B and 7C are cross-sectional and side-view depictions of an embodiment of a system for reducing thermal variation and cooling high density circuit modules.
Figure 7B:
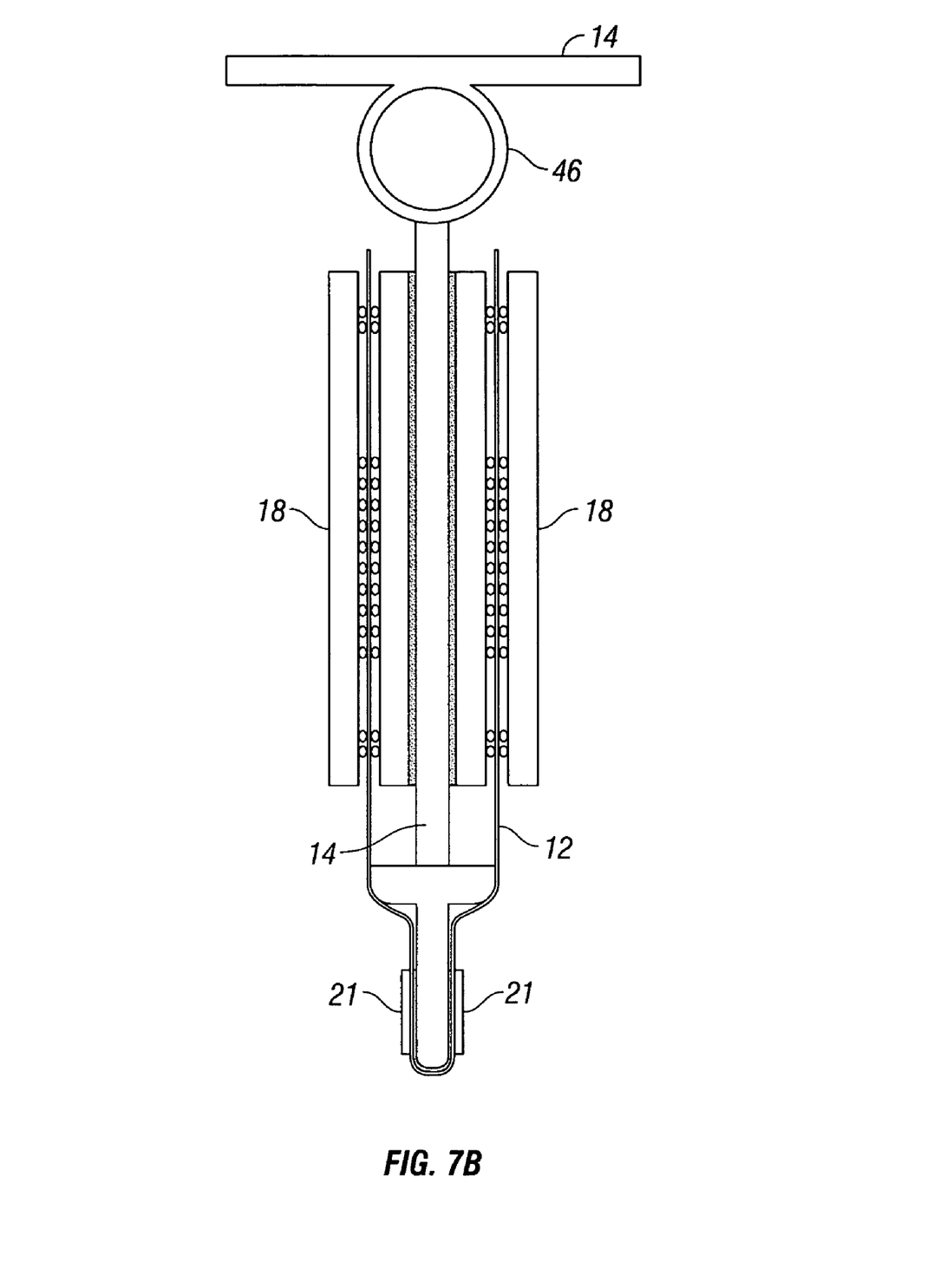
Figure 7C:
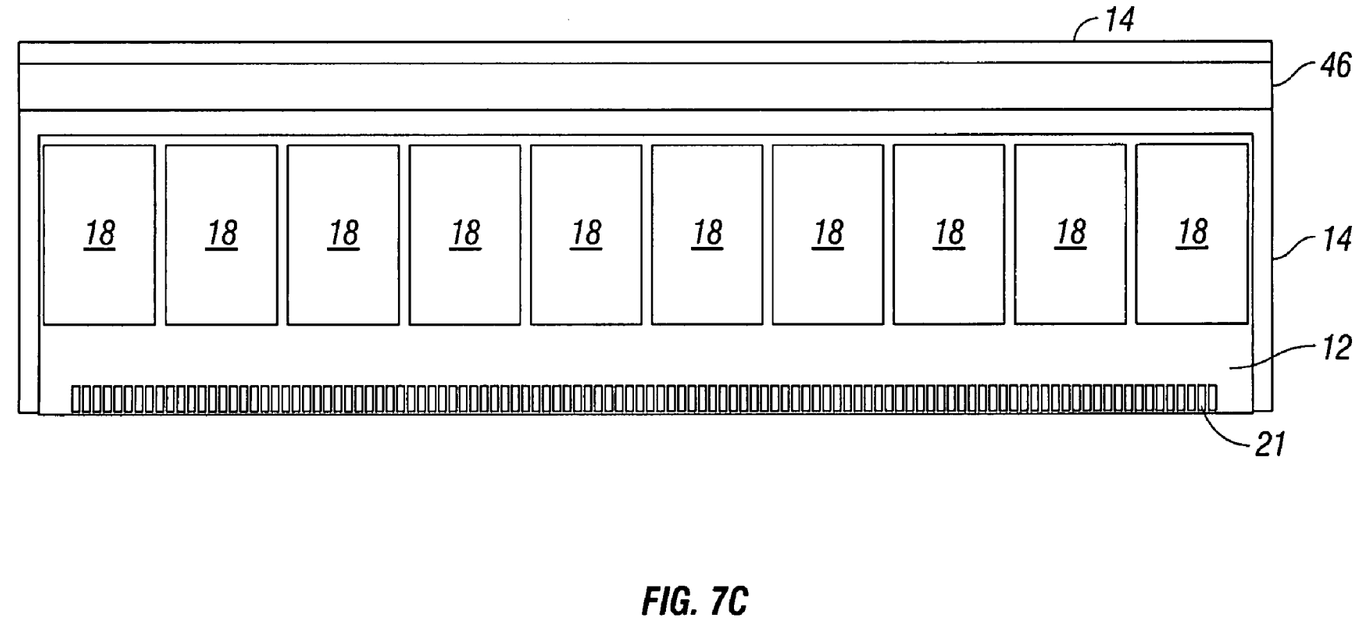

With reference now to FIGS. 7A-7C, shown is another embodiment of the system for reducing thermal variation and cooling circuit modules that includes heat pipe 46. A basic heat pipe is a closed container including a capillary wick structure and a small amount of vaporizable fluid. A heat pipe acts like a high conductance thermal conductor, employing an evaporating-condensing cycle which accepts heat from an external source, uses this heat to evaporate the liquid, and then releases latent heat by condensation (reverse transformation) at a heat sink region. This process is repeated continuously by a feed mechanism (e.g., capillary wick structure) of the condensed fluid back to the heat zone.

FIG. 7A illustrates a cross-sectional view of a heat pipe 46. Heat pipe 46 is a sealed tube manufactured into the structure of circuit module 10. For example, heat pipe 46 may be manufactured into substrate 14 of circuit module 10. Heat pipe 46 includes porous tubular wick 48 and fluid 50. Wick 48 is of an appropriate diameter to remain in contact with the inner walls of heat pipe 46. Wick 48 may comprise porous structures made of materials such as, for example, steel, aluminum, nickel, copper, metal foams, felts, fibrous materials such as ceramics, carbon fibers, etc. Pipe 46 is partially filled with fluid 50 whose boiling point at the pressure within heat pipe 46 is the temperature at or above which cooling is required. Heat pipe 46 is sealed to retain fluid 50 and maintain the pressure selected at manufacture of heat pipe 46.

FIGS. 7B-7C show heat pipe 46 incorporated into substrate 14 of circuit module 10. As shown, heat pipe 46 spans the length of circuit module 10. Circuit module 10 may be a flex-based circuit module, as above. When circuit module 10 is fully assembled, portions of flex circuit 12 and ICs 18 along flex circuit 12 will be adjacent to heat pipe 46. In operation, heat applied anywhere along the surface of heat pipe 46 by conduction from flex circuit 12 and ICs 18 causes vaporization of fluid 50 in an adjacent region of heat pipe 46. The vapor moves by its own pressure to cooler portions of heat pipe 46, where it condenses on the cooler surfaces of cooler portions of heat pipe 46. The condensate fluid 50 is absorbed by wick 48 and transported by capillary action back to the heated adjacent region.

The net effect of the above-described operation of heat pipe 46 is that if any portion of heat pipe 46 (as well as the flex circuit 12 and the ICs in thermal contact with heat pipe 46) is warmer than any other area, the heat from the warmer region is aggressively absorbed as heat of vaporization by fluid 50 and transported by wicking action to the cooler portions of heat pipe 46. This mechanism effectively distributes heat across circuit module 10, thereby maintaining a uniform temperature across the span of heat pipe 46 and the adjacent span of circuit module 10. By distributing heat and removing heat from heat sources, heat pipe 46 also has a cooling effect on circuit module 10.

With continued reference to FIGS. 7A-7C, the embodiment shown effectively reduces thermal variation in circuit module 10. Heat pipe 46 can move much larger amounts of heat with much lower temperature differential than conduction through substrate 14 alone would normally allow. Heat pipe 46 may also be incorporated with the other embodiments shown and described herein (e.g., see FIGS. 1-6). Heat pipe 46 may also be placed at various positions and orientations in circuit module 10, including elsewhere on substrate 14, on flex circuit 12, on ICs 18, in hollow cavity 26, etc. Multiple heat pipes 46 may also be used. The number of heat pipes 46 and positioning of heat pipes 46 may be chosen in order to obtain optimal results based on component placement and cooling flow. Placement of heat pipe 46 close to heat sources (e.g., ICs) and across major cooling surface (e.g., substrate 14 surrounding hollow cavity 26) tends to optimize heat pipe 46 performance. Heat pipe 46 may be used with circuit module 10 or other circuit cards made of any material, as long as there is reasonable heat conduction through the material into the heat-spreading pipe. Placement of heat pipe 46 close to the source of the heat and across the major cooling surface tends to optimize its performance.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module that includes a system for cooling the circuit module, the module comprising:
   (a) a thermally-conductive rigid substrate having first and second lateral sides, an edge, and a cooling chamber integrated with said rigid substrate, the cooling chamber being sealed water-tight and having fluid disposed therein; and
   (b) flex circuitry having first and second sides and a set of edge connector contacts on the first side, the flex circuitry being populated with integrated circuitry and being wrapped about the edge of the thermally-conductive substrate.

2. The circuit module of claim 1 in which the integrated circuits are populated along both the first and second sides of the flex circuitry.

3. The circuit module of claim 1 further comprising one or more fittings for coupling the cooling chamber to a fluid recirculation system.

4. The circuit module of claim 1 in which the integrated circuits include memory circuit integrated circuits.

5. The circuit module of claim 1 in which the thermally-conductive rigid substrate is comprised of aluminum.

6. The circuit module of claim 1 in which the thermally-conductive rigid substrate is comprised of metallic material.

7. The circuit module of claim 1 in which at least one of the integrated circuits populated along the flex circuitry is an advanced memory buffer (AMB).

8. The circuit module of claim 1 in which the circuit module comprises at least one instantiation of a DIMM circuit.

9. The circuit module of claim 1 in which the circuit module comprises at least one instantiation of a fully-buffered DIMM.

* * * * *

UNITED STATES PATENT AND TRADEMARK OFFICE
CERTIFICATE OF CORRECTION

| | |
|---|---|
| PATENT NO. | : 7,289,327 B2 |
| APPLICATION NO. | : 11/364489 |
| DATED | : October 30, 2007 |
| INVENTOR(S) | : Paul Goodwin and James Douglas Wehrly, Jr. |

Page 1 of 1

It is certified that error appears in the above-identified patent and that said Letters Patent is hereby corrected as shown below:

Title Page, Item (73)

Assignee: should read: Staktek Group, L.P.

Signed and Sealed this

Eighteenth Day of December, 2007

JON W. DUDAS
*Director of the United States Patent and Trademark Office*